US012640716B2

(12) United States Patent
Miyamae

(10) Patent No.: US 12,640,716 B2
(45) Date of Patent: May 26, 2026

(54) CXPI LOW EMI TRANSCEIVER

(71) Applicant: Cypress Semiconductor Corporation, San Jose, CA (US)

(72) Inventor: Toru Miyamae, Kasugai (JP)

(73) Assignee: Infineon Technologies Americas Corp., El Segundo, CA (US)

( * ) Notice: Subject to any disclaimer, the term of this patent is extended or adjusted under 35 U.S.C. 154(b) by 93 days.

(21) Appl. No.: 18/669,005

(22) Filed: May 20, 2024

(65) Prior Publication Data

US 2025/0357922 A1    Nov. 20, 2025

(51) Int. Cl.
H03K 5/1252 (2006.01)
H03K 5/04 (2006.01)

(52) U.S. Cl.
CPC ............. H03K 5/1252 (2013.01); H03K 5/04 (2013.01)

(58) Field of Classification Search
CPC ............................... H03K 5/1252; H03K 5/04
See application file for complete search history.

(56) References Cited

U.S. PATENT DOCUMENTS

| | | | |
|---|---|---|---|
| 8,004,330 B1 * | 8/2011 | Acimovic | ........ H03K 19/00361 327/170 |
| 2008/0042696 A1 * | 2/2008 | Redoute | ................... H03K 5/12 327/108 |
| 2023/0035309 A1 * | 2/2023 | Masuda | ................. H04L 25/03 |

OTHER PUBLICATIONS

J. G. Janschitz, "An EMI robust LIN driver with low electromagnetic emission," 2015 10th International Workshop on the Electromagnetic Compatibility of Integrated Circuits (EMC Compo), Edinburgh, UK, 2015, pp. 83-86, (Year: 2015).*
Lee et al. "EMI Effects on Electrical Parameters in Fiber Optic Converters for LIN (Local Interconnect Network) Communication," 2020 International Symposium on Electromagnetic Compatibility—EMC Europe, Rome, Italy, 2020, pp. 1-6 (Year: 2020).*
Schröter et al. "EMC compliant LIN transceiver," 2013 Proceedings of the ESSCIRC (ESSCIRC), Bucharest, Romania, 2013, pp. 363-366 (Year: 2013).*

* cited by examiner

*Primary Examiner* — Sam K Ahn
*Assistant Examiner* — Amneet Singh

(57) ABSTRACT

A system and method of a Clock extension Peripheral Interface (CXPI) low electromagnetic interference (EMI) transceiver that reduces EMI caused by dominant level differences between the master and slave signals. The method includes receiving a bus signal generated based on a first signal associated with a master device and a second signal associated with a slave device. The method includes identifying, based on a predetermined threshold value, a particular portion of a falling edge of the bus signal. The method includes activating a slew rate control on the particular portion of the falling edge of the bus signal to decrease electromagnetic interference (EMI) on the bus signal caused by a difference in dominant levels of the first signal and the second signal.

20 Claims, 10 Drawing Sheets

-- REPLACEMENT SHEET --

800

CXPI LOW EMI TRANSCEIVER

TECHNICAL FIELD

The present disclosure relates generally to the field of electronics, and more particularly, to a Clock extension Peripheral Interface (CXPI) low electromagnetic interference (EMI) transceiver that detects low-voltage levels of a bus signal derived from master and slave signals and adjusts a slew rate of a falling edge of the bus signal based during the low-voltage levels to reduce EMI caused by dominant level differences between the master and slave signals.

BACKGROUND

CXPI is a communication protocol that is based on the automotive communication protocol called Local Interconnect Network (LIN). LIN is a relatively inexpensive serial network protocol that supports remote communication and application within an automobile's network. It is particularly intended for mechatronic nodes in distributed automotive applications, but is equally suited to industrial applications. It is intended to complement the existing Controller Area Network (CAN) leading to hierarchical networks within cars.

BRIEF DESCRIPTION OF THE DRAWINGS

The present disclosure is illustrated by way of example, and not by way of limitation, in the figures of the accompanying drawings in which like reference numerals refer to similar elements and in which.

DETAILED DESCRIPTION

Figure 1:
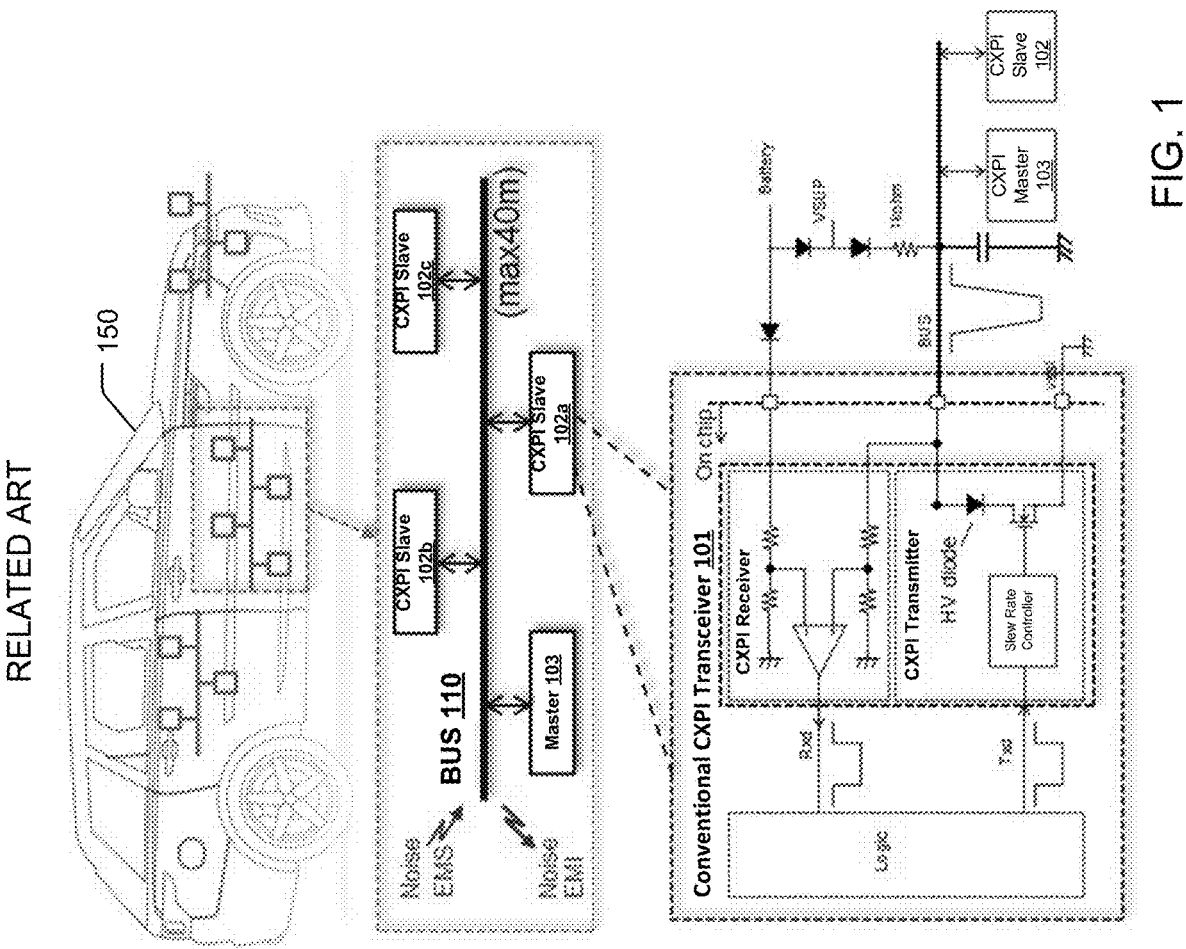
FIG. 1 illustrates a block diagram of an example environment for using a conventional CXPI transceiver to communicate with master and slave devices using a serial network protocol.
Figure 1:

The following description sets forth numerous specific details such as examples of specific systems, components, methods, and so forth, in order to provide a good understanding of various embodiments of the techniques described herein for reducing (or eliminating) EMI on a bus signal caused by dominant level differences between the master and slave signals associated with bus signal, for example, by using an enhanced CXPI system (e.g., circuit). It will be apparent to one skilled in the art, however, that at least some embodiments may be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the scope of the present disclosure.

In a conventional CXPI system, a conventional CXPI transceiver allows a master device and one or more slave devices to communicate across a shared bus and using a serial network protocol. That is, the master device generates a master signal on the bus and the slave device generates a slave signal on the bus, such that each signal is combined to form a bus signal on the bus. The conventional CXPI transceiver receives the bus signal and adjusts the slew rate of the bus signal. If the master device increases the frequency of its master signal (e.g., by reducing the low width of its master signal to 5.5 us or less), then the conventional CXPI system must also reduce its response time on the slave side (e.g., by reducing the low width of the slave signal to less than 5.5 us) so that the slave signal is faster than the master signal; otherwise, the conventional CXPI system could fail the conformance testing.

However, there may be a difference in performance between the master device and the slave device for a variety of difference reasons (e.g., different voltage threshold values between diodes of the master device and diodes of the slave device) that causes the master signal to have a higher dominant level than the dominant level of the slave signal. If this is the case, then speeding up the slave device's response might cause an EMI issue when transitioning the dominant level from master to slave. Consequently, the additional EMI on the shared bus degrades the ability for the master device and/or slave devices to share critical information (e.g., battery levels, telemetry information, braking information, etc.) about the vehicle 150 with each other. Without being able to accurately monitor the performance of the vehicle 150, the CXPI system will not know whether it is necessary to take corrective action to resolve malfunctions of the vehicle and/or avoid potential accidents.

Aspects of the disclosure address the above-noted and other deficiencies by detecting low-voltage levels of a bus signal derived from master and slave signals and adjusting a slew rate of a falling edge of the bus signal based during the low-voltage levels to reduce EMI caused, to at least some extent, by dominant level differences between the master and slave signals.

In an illustrative embodiment, a CXPI system receives a bus signal that is generated based on a first signal associated with a master device and a second signal associated with a slave device. The CXPI system identifies, based on a predetermined threshold value, a particular portion (e.g., a range of voltages during a particular time frame of the bus signal) of a falling edge of the bus signal. The CXPI system activates (e.g., enables) a slew rate control on the particular portion of the falling edge of the bus signal to decrease electromagnetic interference (EMI) on the bus signal caused by a difference in dominant levels of the first signal and the second signal.

FIG. 1 illustrates a block diagram of an example environment for using a conventional CXPI transceiver to communicate with master and slave devices using a serial network protocol. The environment 100 includes an automobile 105 that includes CXPI slave devices 102 (e.g., CXPI slave device 102a, CXPI slave device 102b, CXPI slave device 102c), a CXPI master device 103, and a conventional CXPI transceiver 101 that are each communicatively coupled together via bus 110 which is located on-board the vehicle 150. Each of the coupled devices may transmit/receive any type of communication (e.g., battery level signals) to/from the bus 110. Since CXPI is based on LIN, the transmitter portion of the CXPI transceiver 101 includes a slew rate controller to counter the electromagnetic interference (EMI) caused by the communication of the master and slave devices across the bus 110.

Although FIG. 1 shows that the components (e.g., CXPI slave devices 102, CXPI master device 103, a conventional CXPI transceiver 101, bus 110) are each positioned on vehicle 150, in some embodiments of the present disclosure, the components may be positioned on any type of vehicle including, for example, a land vehicle (e.g., motorcycle, long-haul truck, etc.), a watercraft (e.g., boat), or an aircraft.

Figure 2:
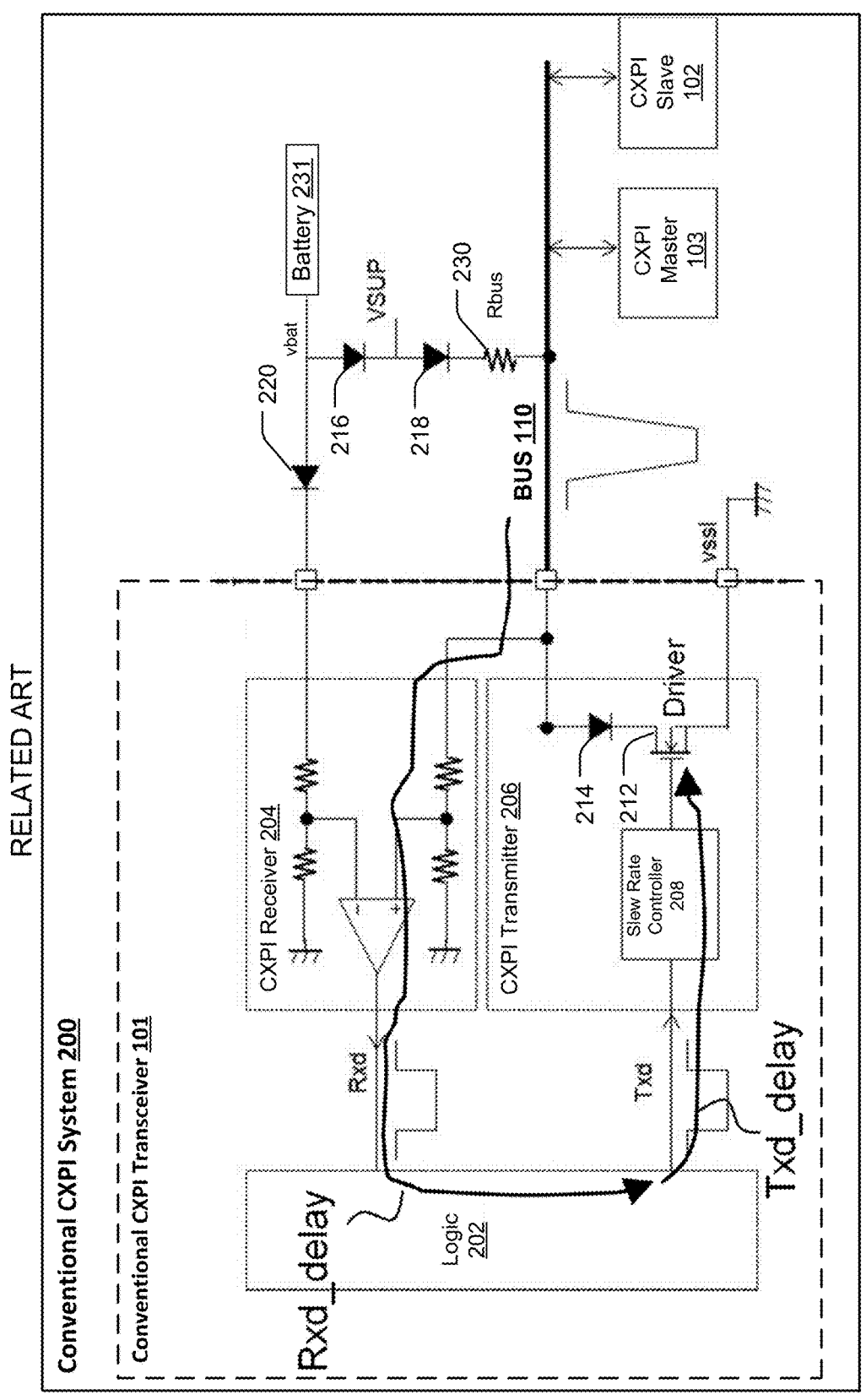
FIG. 2 illustrates a block diagram of a conventional CXPI system 200, according to some embodiments.

FIG. 2 illustrates a block diagram of a conventional CXPI system 200, according to some embodiments. The conventional CXPI system 200 includes the conventional CXPI transceiver 101 in FIG. 1, a battery 231, bus 110, diodes 216, 218, 220, resistor 230 (Rbus), CXPI master device 103, and one or more CXPI slaves devices 102. The CXPI transceiver 101 is communicatively coupled to the CXPI master device 103 and the one or more CXPI slaves devices 102 vis the bus 110.

The conventional CXPI transceiver 101 includes logic device 202 (e.g., one or more processors, a central processing unit (CPU), etc.), CXPI receiver 204, CXPI receiver 204, and CXPI transmitter 206. The CXPI transmitter 206 includes a slew rate controller 208, a driver 212, and diode 214.

Figure 3:
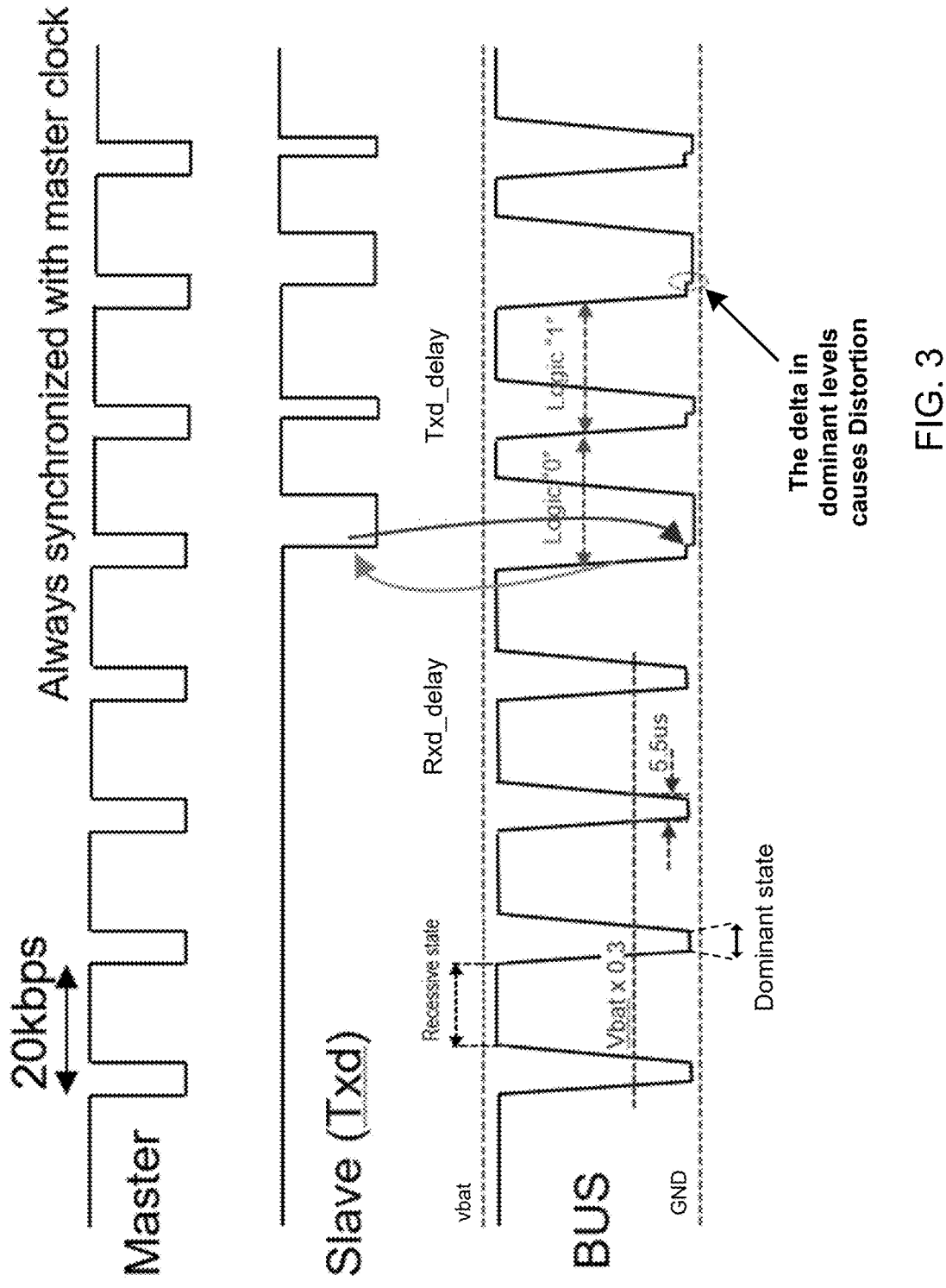
FIG. 3 is a block diagram depicting example waveforms of the conventional CXPI system in FIG. 2, according to some embodiments.

FIG. 3 is a block diagram depicting example waveforms of the conventional CXPI system in FIG. 2, according to some embodiments. Still referring to FIG. 2, the CXPI master device 103 generates a master signal on the bus 110, where the master signal is synchronized with a master clock of the conventional CXPI system 200. The CXPI slave device 102 generates a slave signal on the bus 110. The master signal and the slave signal combine to form a bus signal on the bus 110, which is received by the CXPI receiver 204. The CXPI receiver 204 generates an Rxd signal based on the bus signal and sends the Rxd signal to logic device 202, which in turn, generates a Txd signal based on the Rxd signal and sends the Txd signal to CXPI transmitter 206.

The CXPI transmitter adjusts the slew rate of the bus signal by using its slew rate controller 208, where the slew rate refers to the change of voltage or current per unit of time. Specifically, when Txd is HIGH, then the CXPI system 200 enables the slew rate controller 208 to control the rising slew rate of the bus signal. Conversely, when Txd is LOW, then the CXPI system 200 disables the slew rate control to quickly enable the driver 212. The time difference between the falling edge of the bus signal and the falling edge of the Txd signal is the Rxd_delay. The time difference between the falling edge of the bus signal and the point in time on the bus signal when the CXPI system 200 transitions the dominant level from the master signal to slave signal (Txd) is the Txd_delay.

In the conventional CXPI system 200, EMI was considered not to be a problem because falling slew rate of the bus signal is controlled by the master side (e.g., master device) and the rising slew rate is controlled by slave side (e.g., CXPI transmitter). However, a problem with the conventional CXPI system 200 is that the slave side requires a fast response to meet the conformance testing. That is, if the dominant level of the master signal is higher than the dominant level of the slave device, then speeding up the slave device's response might cause an EMI issue when transitioning the dominant level from master to slave. Consequently, the additional EMI degrades the ability for the master device and/or slave devices to share critical information (e.g., battery levels, telemetry information, braking information, etc.) about the vehicle 150 with each other.

For example, as shown in FIG. 3, conformance testing may be performed with a master low width of 5.5 us. Under this condition, the slave device must respond faster than 5.5 us or else it will fail the conformance testing for CXPI. The CXPI system 200 may use its slew rate controller 208 to control the slew rate of the bus signal and counter the electromagnetic interference (EMI) caused by the communication of the master and slave devices across the bus 110. However, if the slew rate controller 208 sets the slope time to 10 us, then Txd_delay will also be about 10 us and not meet the conformance testing for CXPI. Thus, the CXPI system 200 does not have a countermeasure for EMI related to differences in dominant levels of the master and slave signals.

Figure 4:
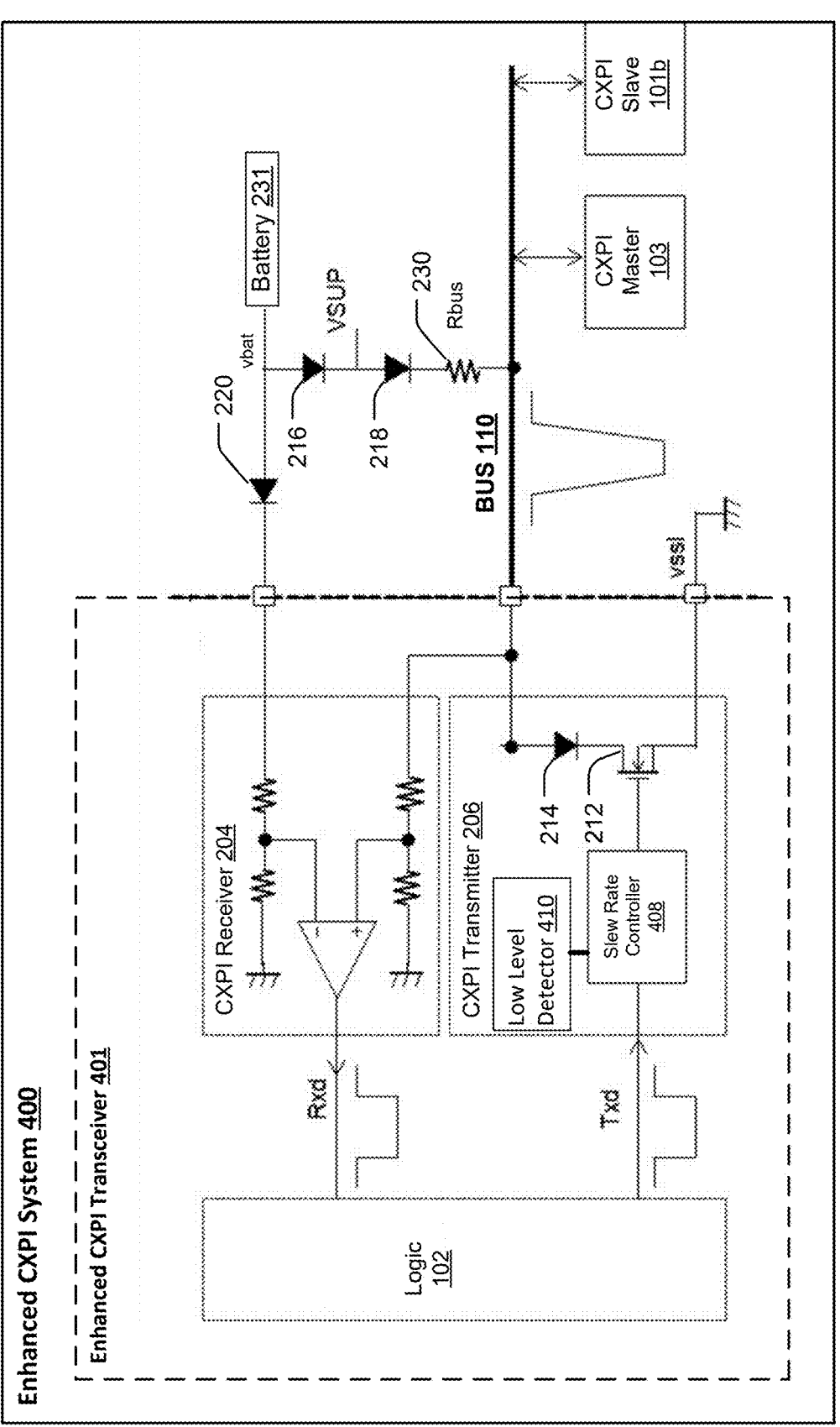
FIG. 4 illustrates a block diagram of an enhanced CXPI system 400, according to some embodiments.

FIG. 4 illustrates a block diagram of an enhanced CXPI system 400, according to some embodiments. The enhanced CXPI system 400 includes an enhanced CXPI transceiver 401, a battery 231, a bus 110, diodes 216 and 218, a resistor 230 (Rbus), a CXPI master device 103, and one or more CXPI slaves devices 102. The enhanced CXPI transceiver 401 is communicatively coupled to the CXPI master device 103 and the one or more CXPI slaves devices 102 via the bus 110.

The enhanced CXPI transceiver 401 includes a logic device 202 (e.g., one or more processors, a central processing unit (CPU), etc.), CXPI receiver 204, and enhanced CXPI transmitter 406. The enhanced CXPI transmitter 406 includes an enhanced slew rate controller 408, a driver 212, a diode 214, and a low level detector 420.

Thus, the enhanced CXPI system 400 includes the same components as the conventional CXPI system 200 in FIG. 2, but replaces the CXPI transmitter 206 with an enhanced CXPI transmitter 406 that includes a low level detector 410 to detect low levels of the bus signal and an enhanced slew rate controller 408 that, when enabled, may increase or decrease the slew rate of a rising and/or falling edge of the bus signal. By using the low level detector 410 and the enhanced slew rate controller 408, the enhanced CXPI system 400 can reduce any EMI on the bus signal that is caused, to at least some extent, by the dominant level differences between the master and slave signals.

Specifically, the low level detector 410 is configured to continuously monitor and measure the bus signal to determine if the bus signal is less than or equal to a predetermined threshold value that corresponds to low bus levels. In some embodiments, a low bus level may be any voltage that is less than or equal to 30% of the battery voltage (e.g., vbat) provided from the battery 231. However, in other embodiments, a different predetermined threshold value (e.g., 10%, 20%, 50%) may used to detect when the bus signal is at a low bus level. For each measured voltage, the low level detector 410 sends a low-level (LL) signal to the enhanced slew rate controller 408, where the LL signal indicates whether the bus signal is at a low bus level, as defined by the predetermined threshold value.

The enhanced slew rate controller 408 is configured to reduce (e.g., mitigate or eliminate) the EMI caused, to at least some extent, by any dominant level differences between the master and slave signals on the bus signal by enabling the slew rate control on the falling edge of the bus signal whenever the LL signal indicates that the falling edge is at a low bus level, and disabling the slew rate control on the falling edge of the bus signal whenever the LL signal indicates that the falling edge is no longer at the low bus level.

Conversely, the enhanced slew rate controller 408 is configured to apply the slew rate control to any or all portions of the rising edge of the bus signal. For example, the enhanced slew rate controller 408 may apply slew rate control to the rising edge of the bus signal only when the bus signal is below (including equal to) and/or above the predetermined threshold value.

In some embodiments, the enhanced CXPI transceiver 401 receives a bus signal generated based on a first signal associated with a master device and a second signal associated with a slave device. In some embodiments, the enhanced CXPI transceiver 401 identifies, based on a predetermined threshold value, a particular portion of a falling edge of the bus signal. In some embodiments, the enhanced CXPI transceiver 401 activates a slew rate control on the particular portion of the falling edge of the bus signal to decrease EMI on the bus signal caused by a difference in dominant levels of the first signal and the second signal.

In some embodiments, a dominant level of the first signal is higher than a dominant level of the second signal, wherein the first signal is synchronous with a master clock and the second signal is asynchronous with the master clock.

In some embodiments, the enhanced CXPI transceiver 401 identifies, based on the predetermined threshold value, a different portion of the falling edge of the bus signal. In some embodiments, the enhanced CXPI transceiver 401 prevents (e.g., by disabling the slew rate control) an activation of the slew rate control on the different portion of the falling edge of the bus signal.

In some embodiments, the enhanced CXPI transceiver 401 determines to activate the slew rate control on a rising edge of the bus signal that is subsequent to the falling edge. In some embodiments, the enhanced CXPI transceiver 401 activates the slew rate control on the rising edge of the bus signal responsive to determining to activate the slew rate control on the rising edge of the bus signal.

In some embodiments, the enhanced CXPI transceiver 401 determines to activate the slew rate control on the rising edge of the bus signal that is subsequent to the falling edge without regard to the predetermined threshold value.

In some embodiments, the enhanced CXPI transceiver 401 identifies the particular portion of the falling edge of the bus signal based on a low level detector 410 (e.g., voltage detector) that is coupled to a driver in a cascade configuration.

In some embodiments, the enhanced CXPI transceiver 401 identifies the particular portion of the falling edge of the bus signal based on a slew rate controller. In some embodiments, the enhanced CXPI transceiver 401 routes a feedback voltage from an output of the low level detector 410 to an input of the slew rate controller 208.

In some embodiments, the enhanced CXPI transceiver 401 identifies the particular portion of the falling edge of the bus signal based on the low level detector 410 that is coupled to a driver in a non-cascade configuration.

In some embodiments, the enhanced CXPI transceiver 401 activates the slew rate control on the particular portion of the falling edge of the bus signal by decreasing a slew rate on the particular portion of the falling edge of the bus signal.

In some embodiments, the enhanced CXPI transceiver 401 receives, via the bus 110 (e.g., a signal path), a first signal associated with a first device (e.g., CXPI master device 103) and a second signal associated with a second device (e.g., CXPI slave 101b). In some embodiments, the enhanced CXPI transceiver 401 detects a voltage difference between a dominant level of the first signal and a dominant level of the second signal. In some embodiments, the enhanced CXPI transceiver 401 generates, based on the first signal and the second signal, a bus signal on the signal path. In some embodiments, the enhanced CXPI transceiver 401 adjusts a slew rate of the bus signal based on the voltage difference.

Figure 5A:
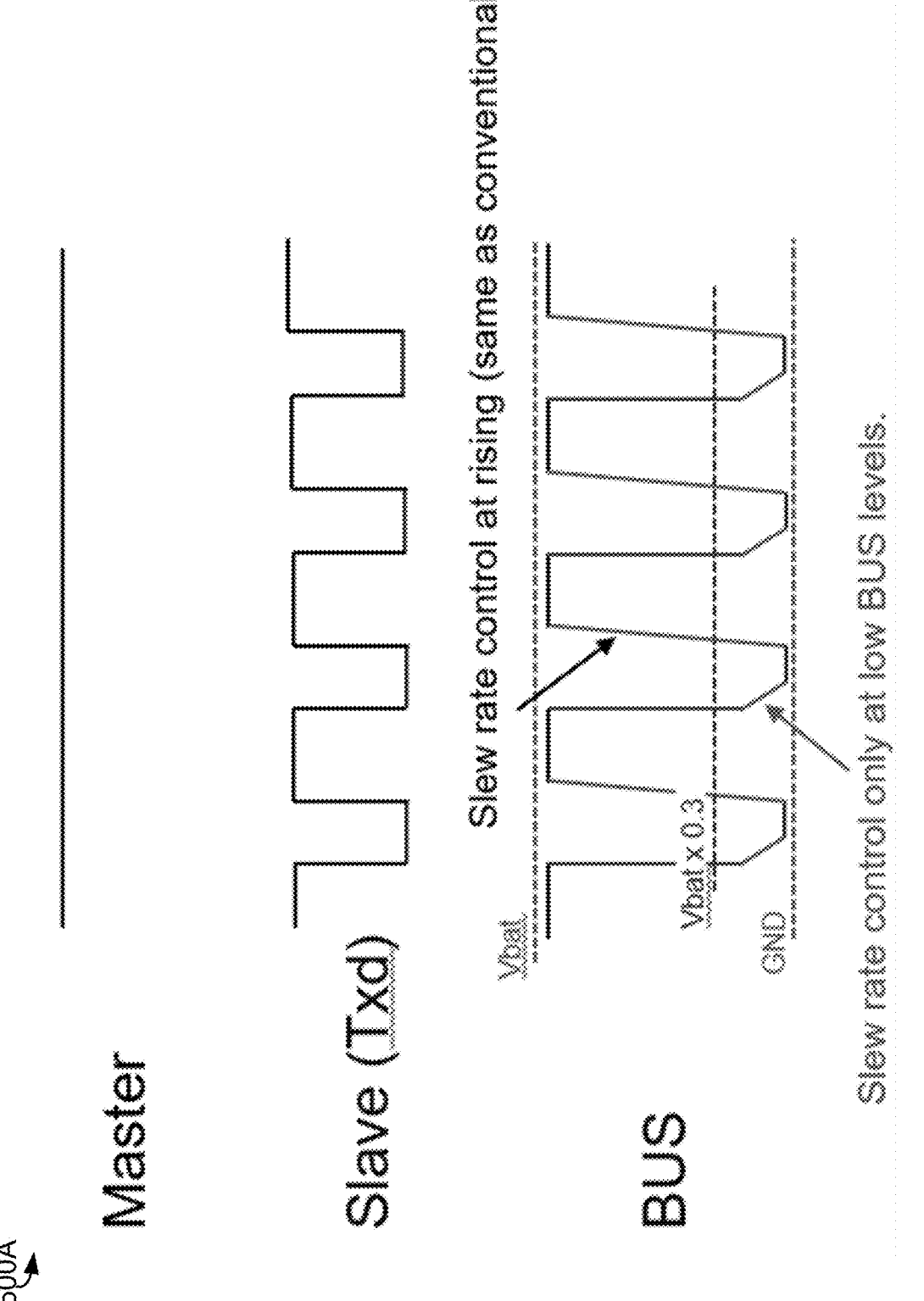
FIG. 5A is a block diagram depicting an example waveform of the bus signal that is adjusted by the enhanced CXPI system in FIG. 4 when there is no master signal, according to some embodiments.

FIG. 5A is a block diagram depicting an example waveform of the bus signal that is adjusted by the enhanced CXPI system in FIG. 4 when there is no master signal, according to some embodiments. That is, the enhanced CXPI transceiver 401 detects that there is a voltage difference in dominant levels of the master and slave signals that causes EMI on the bus signal when transitioning the dominant level from master to slave. To reduce the EMI, the enhanced CXPI transceiver 101 uses its enhanced slew rate controller 408 to decrease the slew rate on the falling edge of the bus signal for voltage levels that are equal to or below a predetermined threshold value (e.g., 30% of vbat) so that the bus signal no longer shows the voltage difference in dominant levels of the master and slave signals. Conversely, the enhanced slew rate controller 408 applies the slew rate control to any or all portions of the rising edge of the bus signal.

Figure 5B:
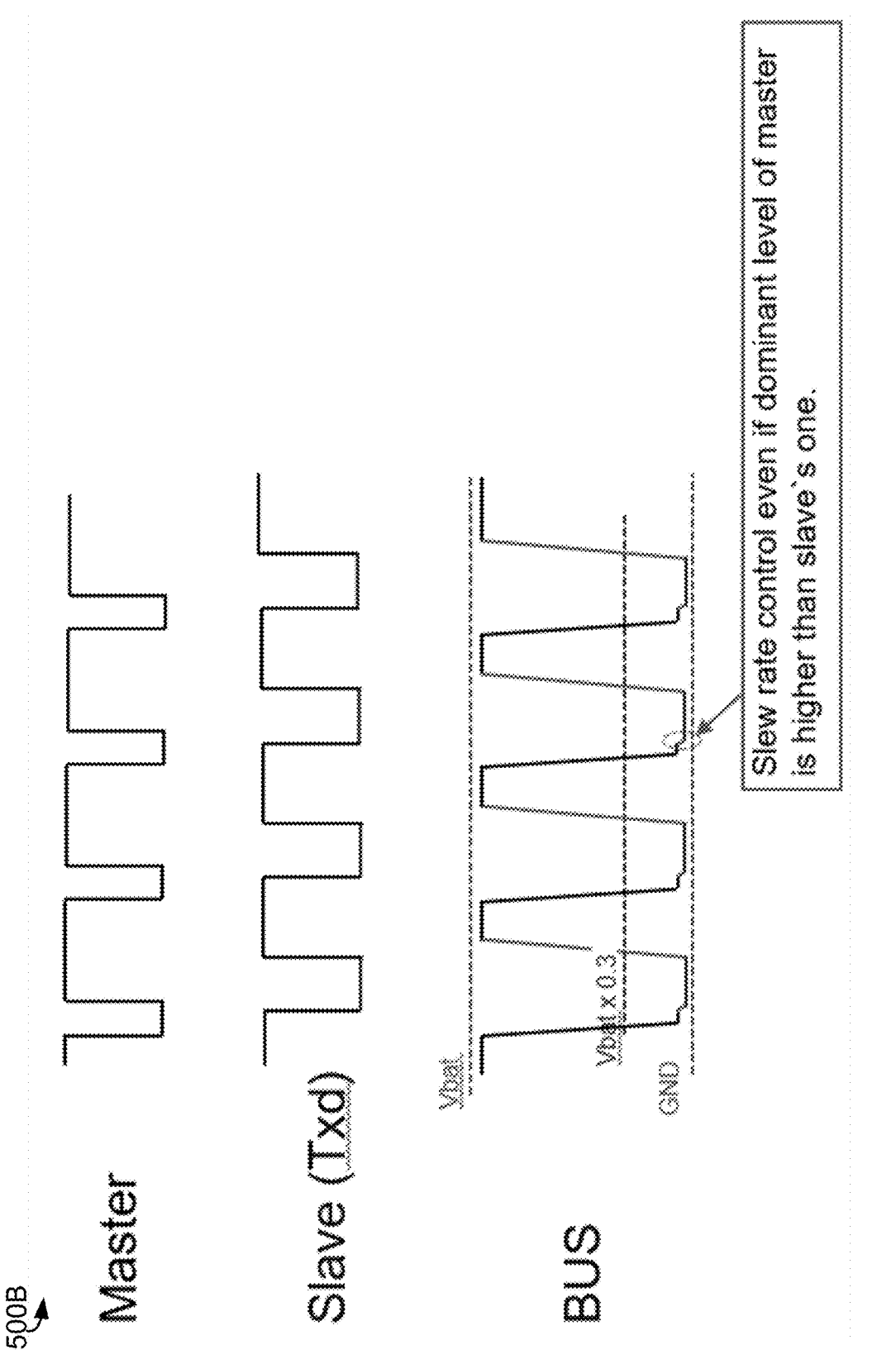
FIG. 5B is a block diagram depicting an example waveform of the bus signal that is adjusted by the enhanced CXPI system in FIG. 4 when there is a master signal, according to some embodiments.

FIG. 5B is a block diagram depicting an example waveform of the bus signal that is adjusted by the enhanced CXPI system in FIG. 4 when there is a master signal, according to some embodiments. Similar to FIG. 5A, the enhanced CXPI transceiver 401 detects that there is a voltage difference in dominant levels of the master and slave signals that causes EMI on the bus signal when transitioning the dominant level from master to slave. To reduce the EMI, the enhanced CXPI transceiver 101 uses its enhanced slew rate controller 408 to decrease the slew rate on the falling edge of the bus signal for voltage levels that are equal to or below a predetermined threshold value (e.g., 30% of vbat) so that the bus signal no longer shows the voltage difference in dominant levels of the master and slave signals. Conversely, the enhanced slew rate controller 408 applies the slew rate control to any or all portions of the rising edge of the bus signal.

Figure 6:
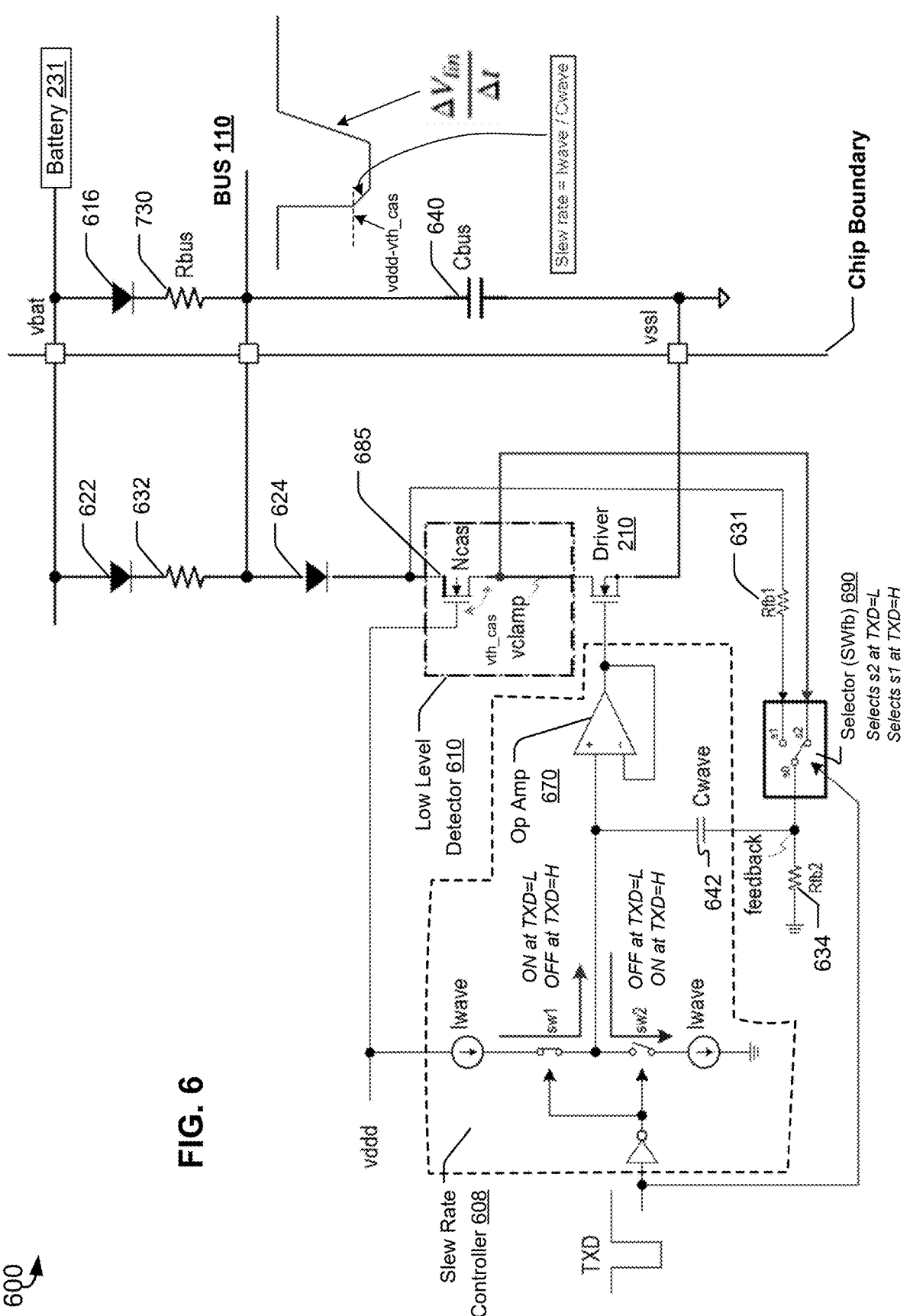
FIG. 6 illustrates a block diagram of an example CXPI transmitter that includes a driver in a cascade configuration, according to some embodiments.

FIG. 6 illustrates a block diagram of an example CXPI transmitter that includes a driver in a cascade configuration, according to some embodiments. The CXPI transmitter 600 includes slew rate controller 608, a low level detector 610, a selector (SWfb) 690, resistor 632, and diodes 622, 624. The CXPI transmitter 600 is coupled to bus 110, which is coupled to resistor 630 (Rbus), diode 616, capacitor 640 (Cbus), and battery 231.

The slew rate controller 608 includes sw1, sw2, op amp 670, and capacitor 642 (Cwave). The low level detector 610 includes transistor 685 (Ncas).

When TXD is low, then SW1 closes, SW2 opens, and selector 690 selects path s2 as the feedback. Conversely, when TXD is high, then SW1 closes, SW2 opens, and selector 690 selects path s1 as the feedback.

As shown in FIG. 6, the driver 210 is configured in a cascade connection type, which allows the vclamp node of the low level detector 610 to be used as the output of the low level detector 610. For example, if vddd=3V and vth_cas=1V, then the slew rate control can start from about 2V of the bus signal.

In some embodiments, the slew rate of the falling edge is defined by the following equation:

$$\text{Slew Rate}_{fe} = \frac{I_{wave}}{C_{wave}} \quad (1)$$

In some embodiments, the slew rate for the rising edge is defined by the following equations:

$$\frac{\Delta V_{tin}}{\Delta t} \approx \frac{I_{wave}}{C_{wave} * \dfrac{R_{fb2}}{R_{fb1} + R_{fb2}}} \quad (2)$$

$$I_{wave} \ll Vlin(R_{fb1} + R_{fb2})) \quad (3)$$

The slew rate controller 608 control the slew rate of the bus signal based on the mirror effect. The slew rate controller 608 adjusts the slew rate of the falling edge of the bus signal at only low dominant levels by changing the feedback to come from the output of the low level detector 610 (e.g., vclamp). Conversely, the slew rate controller 608 adjusts the slew rate of the rising edge of the bus signal by reverting the feedback to come from the normal node.

Figure 7:
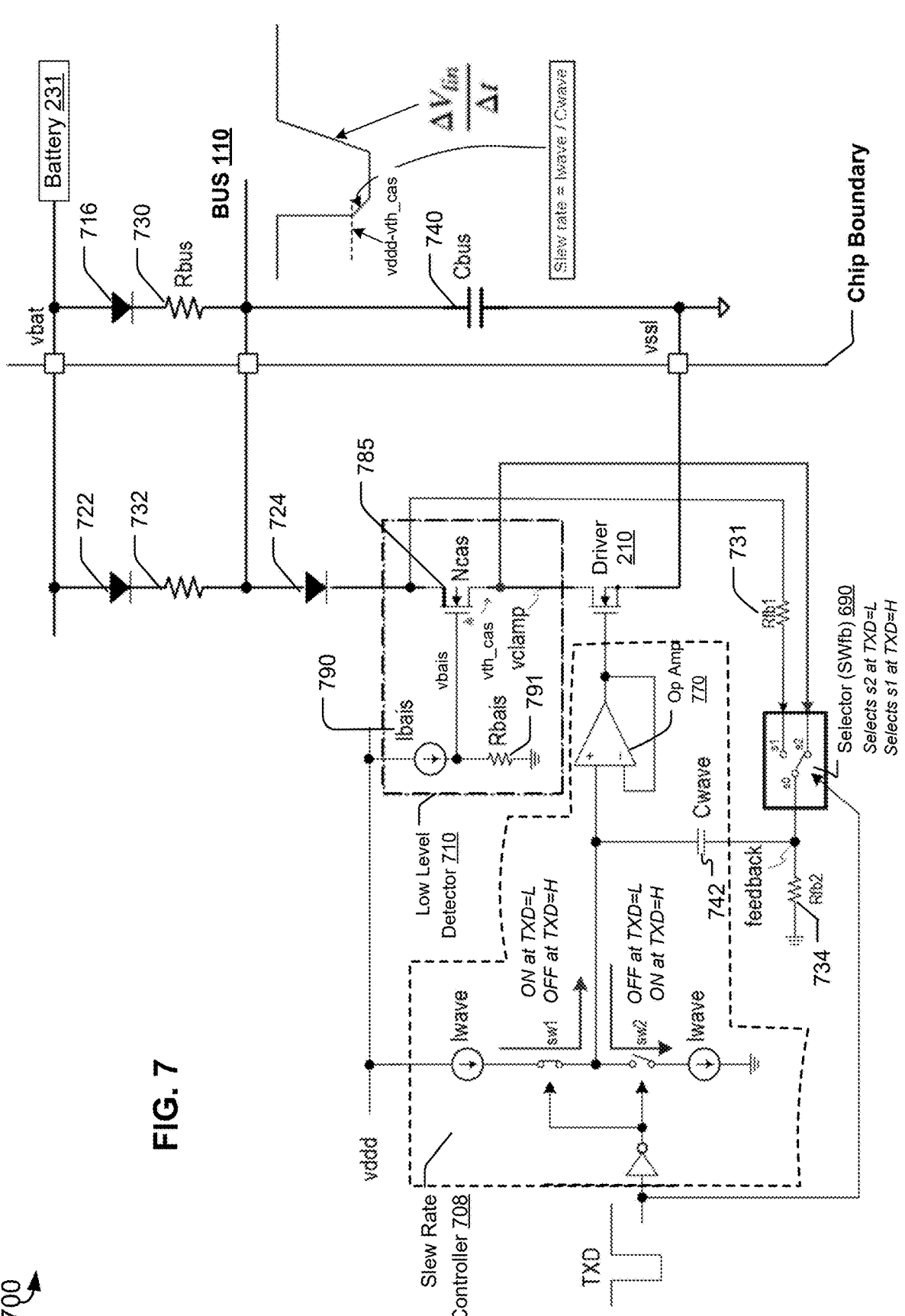
FIG. 7 illustrates a block diagram of an example CXPI transmitter that includes a driver in a cascade configuration, according to some embodiments.

FIG. 7 illustrates a block diagram of an example CXPI transmitter that includes a driver in a cascade configuration, according to some embodiments. The CXPI transmitter 700 includes slew rate controller 708, a low level detector 710, a selector (SWfb) 790, resistor 732, and diodes 722, 724. The CXPI transmitter 700 is coupled to bus 110, which is coupled to resistor 730 (Rbus), diode 716, capacitor 740 (Cbus), and battery 231.

The slew rate controller 708 includes sw1, sw2, op amp 670, and capacitor 742 (Cwave). The low level detector 710 includes transistor 785 (Ncas) and resistor 791 (Rbais).

When TXD is low, then SW1 closes, SW2 opens, and selector 790 selects path s2 as the feedback. Conversely, when TXD is high, then SW1 closes, SW2 opens, and selector 790 selects path s1 as the feedback.

In some embodiments, the slew rate of the falling edge of is defined by equation (1). In some embodiments, the slew rate for the rising edge is defined by equations (2) and (3).

The CXPI transmitter 700 can adjust the slew rate to any starting point of slew rate control by applying vbias as shown in FIG. 7.

Figure 8:
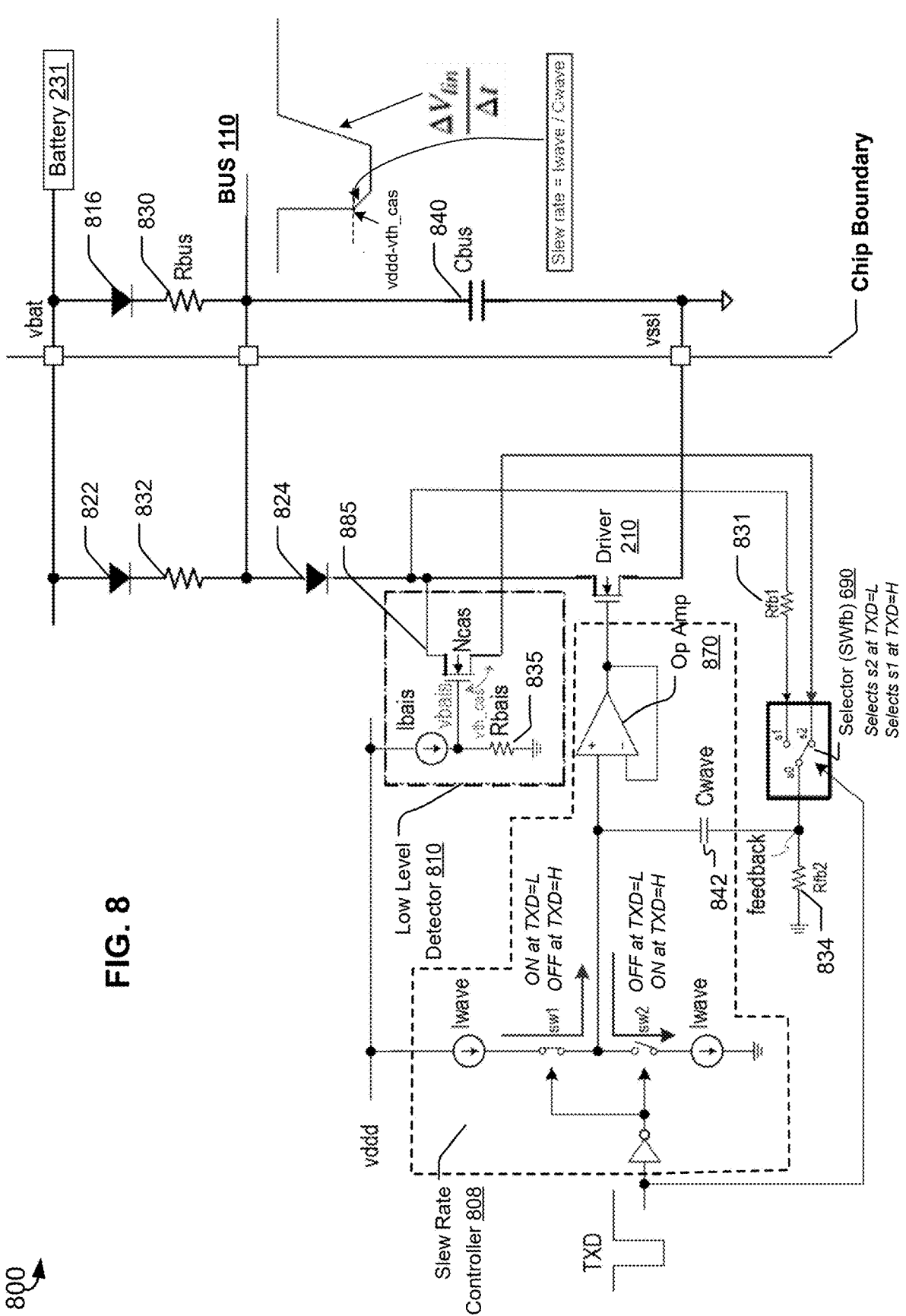
FIG. 8 illustrates a block diagram of an example CXPI transmitter that includes a driver in a non-cascade configuration, according to some embodiments.

FIG. 8 illustrates a block diagram of an example CXPI transmitter that includes a driver in a non-cascade configuration, according to some embodiments. The CXPI transmitter 800 includes slew rate controller 808, a low level detector 810, a selector (SWfb) 890, resistor 832, and diodes 822, 824. The CXPI transmitter 800 is coupled to bus 110, which is coupled to resistor 830 (Rbus), diode 816, capacitor 840 (Cbus), and battery 231.

The slew rate controller 808 includes sw1, sw2, op amp 870, and capacitor 842 (Cwave). The low level detector 810 includes transistor 885 (Ncas) and resistor 891 (Rbais).

When TXD is low, then SW1 closes, SW2 opens, and selector 890 selects path s2 as the feedback. Conversely, when TXD is high, then SW1 closes, SW2 opens, and selector 890 selects path s1 as the feedback.

In some embodiments, the slew rate of the falling edge of is defined by equation (1). In some embodiments, the slew rate for the rising edge is defined by equations (2) and (3).

Figure 9:
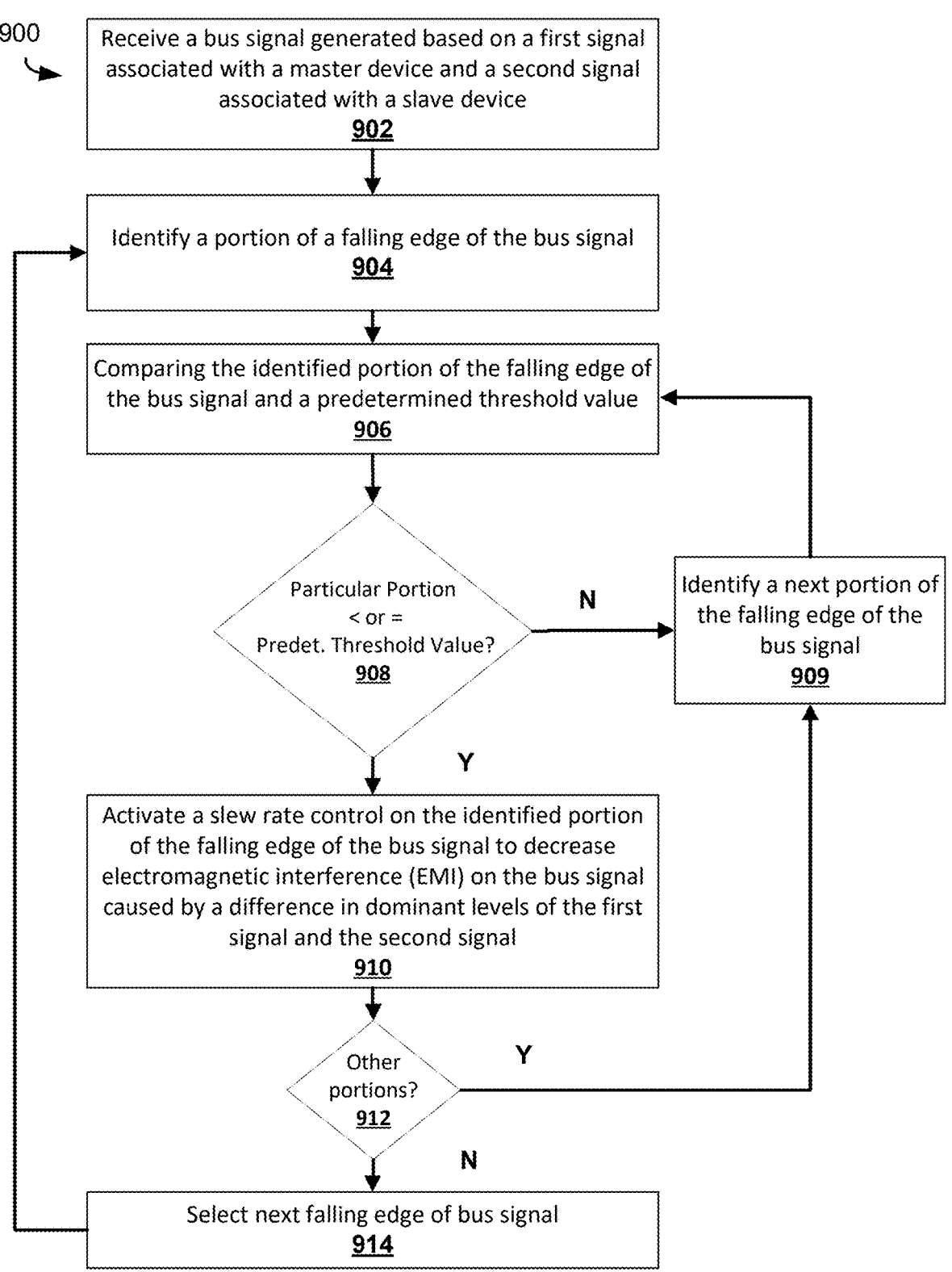
FIG. 9 is a flow diagram of a procedure for using an enhanced CXPI system to reduce EMI caused by dominant level differences between master and slave signals, according to some embodiments.

FIG. 9 is a flow diagram of a procedure for using an enhanced CXPI system to reduce EMI caused by dominant level differences between master and slave signals, according to some embodiments. Although the operations are depicted in FIG. 9 as integral operations in a particular order for purposes of illustration, in other implementations, one or more operations, or portions thereof, are performed in a different order, or overlapping in time, in series or parallel, or are omitted, or one or more additional operations are added, or the method is changed in some combination of ways. In some embodiments, the procedure 900 may be performed by processing logic that includes hardware (e.g., circuitry, dedicated logic, programmable logic, microcode, etc.), firmware, or a combination thereof. In some embodiments, some or all operations of procedure 900 may be performed by one or more components (e.g., low level detector 610, slew rate controller 608, driver 210, selector 690, etc.) of an enhanced CXPI system.

The procedure 900 will be described with respect to the enhanced CXPI system 400 in FIG. 4, but may also be implemented using the enhanced CXPI system 600 in FIG. 6, enhanced CXPI transmitter 700 in FIG. 7, and/or enhanced CXPI system 800 in FIG. 8. At operation 902, in some embodiments, the enhanced CXPI system 400 receive a bus signal generated based on a first signal associated with a master device and a second signal associated with a slave device. At operation 904, in some embodiments, the enhanced CXPI system 400 identifies a portion of a falling edge of the bus signal. At operation 906, in some embodiments, the enhanced CXPI system 400 compares the identified portion of the falling edge of the bus signal and a predetermined threshold value. If the particular portion is greater than the predetermined threshold, then the enhanced CXPI system 400 proceeds to operation 909 to identify a next portion of the falling edge of the bus signal and then proceed to operation 906.

Alternatively, if the particular portion is less than or equal to the predetermined threshold, then the enhanced CXPI system 400 proceeds to operation 910 to activate a slew rate control on the identified portion of the falling edge of the bus signal to decrease electromagnetic interference (EMI) on the bus signal caused by a difference in dominant levels of the first signal and the second signal.

At operation 912, in some embodiments, the enhanced CXPI system 400 determines whether there are other portions of the bus signal that have not yet been checked, and if there is an unchecked portion, then the enhanced CXPI system 400 proceeds to operation 909 to repeat operation 909 using the unchecked portion. Alternatively, if there are no unchecked portions of the bus signal, then the enhanced CXPI system 400 proceeds to operation 914 to select the next falling edge of bus signal, and then proceeds to operation 904 to repeat operation 904 using the next falling edge.

In the above description, some portions of the detailed description are presented in terms of algorithms and symbolic representations of operations on analog signals and/or digital signals or data bits within a non-transitory storage medium. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment of the disclosure. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "identifying." "activating," "preventing," "determining," "decreasing" or the like, refer to the actions and processes of an integrated circuit (IC) controller, or similar electronic device, that manipulates and transforms data represented as physical (e.g., electronic) quantities within the controller's registers and memories into other data similarly represented as physical quantities within the controller memories or registers or other such information non-transitory storage medium.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such.

Embodiments described herein may also relate to an apparatus (e.g., such as an AC-DC converter, and/or an ESD protection system/circuit) for performing the operations herein. This apparatus may be specially constructed for the required purposes, or it may include firmware or hardware logic selectively activated or reconfigured by the apparatus. Such firmware may be stored in a non-transitory computer-readable storage medium, such as, but not limited to, read-only memories (ROMs), random access memories (RAMs), EPROMs, EEPROMs, flash memory, or any type of media suitable for storing electronic instructions. The term "computer-readable storage medium" should be taken to include a single medium or multiple media that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The above description sets forth numerous specific details such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
   receiving a bus signal generated based on a first signal associated with a master device and a second signal associated with a slave device;
   identifying, based on a predetermined threshold value, a particular portion of a falling edge of the bus signal; and
   activating a slew rate control on the particular portion of the falling edge of the bus signal to decrease electromagnetic interference (EMI) on the bus signal caused by a difference in dominant levels of the first signal and the second signal.

2. The method of claim 1, wherein a first dominant level of the first signal is higher than a second dominant level of the second signal, wherein the first signal is synchronous with a master clock and the second signal is asynchronous with the master clock.

3. The method of claim 1, further comprising:
   identifying, based on the predetermined threshold value, a different portion of the falling edge of the bus signal; and
   preventing an activation of the slew rate control on the different portion of the falling edge of the bus signal.

4. The method of claim 1, further comprising:
   determining to activate the slew rate control on a rising edge of the bus signal that is subsequent to the falling edge; and activating the slew rate control on the rising edge of the bus signal responsive to determining to activate the slew rate control on the rising edge of the bus signal.

5. The method of claim 4, wherein determining to activate the slew rate control on the rising edge of the bus signal that is subsequent to the falling edge is without regard to the predetermined threshold value.

6. The method of claim 1, wherein identifying the particular portion of the falling edge of the bus signal is further based on a voltage detector that is coupled to a driver in a cascade configuration.

7. The method of claim 6, wherein identifying the particular portion of the falling edge of the bus signal is further based on a slew rate controller, and further comprising:
routing a feedback voltage from an output of the voltage detector to an input of the slew rate controller.

8. The method of claim 1, wherein identifying the particular portion of the falling edge of the bus signal is further based on a voltage detector that is coupled to a driver in a non-cascade configuration.

9. The method of claim 8, wherein identifying the particular portion of the falling edge of the bus signal is further based on a slew rate controller, and further comprising:
routing a feedback voltage from an output of the voltage detector to an input of the slew rate controller.

10. The method of claim 1, wherein activating the slew rate control on the particular portion of the falling edge of the bus signal comprises:
decreasing a slew rate on the particular portion of the falling edge of the bus signal.

11. An integrated circuit, comprising:
a voltage detector configured to:
receive a bus signal generated based on a first signal associated with a master device and a second signal associated with a slave device;
identify, based on a predetermined threshold value, a particular portion of a falling edge of the bus signal; and
a slew rate controller configured to:
activate a slew rate control on the particular portion of the falling edge of the bus signal to decrease electromagnetic interference (EMI) on the bus signal caused by a difference in dominant levels of the first signal and the second signal.

12. The integrated circuit of claim 11, wherein a first dominant level of the first signal is higher than a second dominant level of the second signal, wherein the first signal is synchronous with a master clock and the second signal is asynchronous with the master clock.

13. The integrated circuit of claim 11, wherein
the voltage detector configured is further configured to:
identify, based on the predetermined threshold value, a different portion of the falling edge of the bus signal; and
the slew rate controller is further configured to:
prevent an activation of the slew rate control on the different portion of the falling edge of the bus signal.

14. The integrated circuit of claim 11, wherein the slew rate controller is further configured to:
determine to activate the slew rate control on a rising edge of the bus signal that is subsequent to the falling edge; and
activate the slew rate control on the rising edge of the bus signal responsive to determining to activate the slew rate control on the rising edge of the bus signal.

15. The integrated circuit of claim 14, wherein to determine to activate the slew rate control on the rising edge of the bus signal is without regard to the predetermined threshold value.

16. The integrated circuit of claim 11, wherein the voltage detector is further coupled to a driver in a cascade configuration.

17. The integrated circuit of claim 16, wherein the voltage detector is further to:
route a feedback voltage to an input of the slew rate controller.

18. The integrated circuit of claim 11, wherein the voltage detector is further coupled to a driver in a non-cascade configuration.

19. The integrated circuit of claim 11, wherein the slew rate controller is further to:
decrease a slew rate on the particular portion of the falling edge of the bus signal.

20. A method comprising:
receiving, via a signal path, a first signal associated with a first device and a second signal associated with a second device;
detecting a voltage difference between a dominant level of the first signal and a dominant level of the second signal;
generating, based on the first signal and the second signal, a bus signal on the signal path; and
adjusting a slew rate of the bus signal based on the voltage difference.

* * * * *